US010599170B2

(12) United States Patent
Jeong

(10) Patent No.: US 10,599,170 B2
(45) Date of Patent: Mar. 24, 2020

(54) INTERNAL VOLTAGE GENERATION CIRCUIT AND MEMORY DEVICE INCLUDING THE INTERNAL VOLTAGE GENERATION CIRCUIT

(71) Applicant: SK hynix Inc., Icheon-si, Gyeonggi-do (KR)

(72) Inventor: Chan Hui Jeong, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/237,379

(22) Filed: Dec. 31, 2018

(65) Prior Publication Data

US 2019/0355395 A1    Nov. 21, 2019

(30) Foreign Application Priority Data

May 15, 2018  (KR) .................. 10-2018-0055555

(51) Int. Cl.
| | |
|---|---|
| G05F 1/10 | (2006.01) |
| G11C 5/14 | (2006.01) |
| G11C 16/10 | (2006.01) |
| G11C 16/26 | (2006.01) |
| G11C 16/30 | (2006.01) |
| G11C 11/00 | (2006.01) |
| G05F 3/02 | (2006.01) |

(52) U.S. Cl.
CPC .............. *G05F 1/10* (2013.01); *G11C 5/147* (2013.01); *G11C 11/00* (2013.01); *G11C 16/10* (2013.01); *G11C 16/26* (2013.01); *G11C 16/30* (2013.01); *G05F 3/02* (2013.01)

(58) Field of Classification Search
CPC ... G05F 1/10; G05F 3/02; G11C 11/00; G11C 5/147; G11C 16/30; G11C 16/26; G11C 16/10
See application file for complete search history.

(56) References Cited

U.S. PATENT DOCUMENTS

| | | | | |
|---|---|---|---|---|
| 8,289,800 | B2* | 10/2012 | Futatsuyama | G11C 16/30 |
| | | | | 365/226 |
| 2004/0017690 | A1* | 1/2004 | Lee | G11C 5/147 |
| | | | | 365/145 |

(Continued)

FOREIGN PATENT DOCUMENTS

| | | |
|---|---|---|
| KR | 101347538 B1 | 1/2014 |
| KR | 1020170010515 A | 2/2017 |

*Primary Examiner* — Ajay Ojha
(74) *Attorney, Agent, or Firm* — William Park & Associates Ltd.

(57) ABSTRACT

Provided herein may be an internal voltage generation circuit and a memory device having the same. The internal voltage generation circuit may include an integration circuit configured to generate an initial voltage that increases with a constant slope based on an input voltage, a selection circuit configured to compare a feedback voltage with a reference voltage and then output the initial voltage or the reference voltage as an output voltage, and a first internal voltage generation circuit configured to generate an internal voltage by being supplied with an external supply voltage or by being blocked from being supplied with the external supply voltage based on a result of a comparison between the output voltage and the feedback voltage and to generate the feedback voltage by dividing the internal voltage.

20 Claims, 7 Drawing Sheets

(56) References Cited

U.S. PATENT DOCUMENTS

2009/0134703 A1* 5/2009 Chung .................... H02J 1/102
 307/64
2010/0283516 A1* 11/2010 Choi ....................... G05F 3/242
 327/143

* cited by examiner

US 10,599,170 B2

INTERNAL VOLTAGE GENERATION CIRCUIT AND MEMORY DEVICE INCLUDING THE INTERNAL VOLTAGE GENERATION CIRCUIT

CROSS-REFERENCE TO RELATED APPLICATION

The present application claims priority under 35 U.S.C. § 119(a) to Korean patent application number 10-2018-0055555 filed on May 15, 2018, in the Korean Intellectual Property Office, the entire disclosure of which is incorporated herein by reference.

BACKGROUND

1. Technical Field

Various embodiments of the present disclosure generally relate to an electronic device, and more particularly, to an internal voltage generation circuit and a memory device having the internal voltage generation circuit.

2. Related Art

Interest in and importance of a memory device are increasingly growing with an increased use of mobile information devices, in particular, smart phones, tablet PCs, etc., using a memory system as a storage medium.

Due not only to parallelization using a high-speed processor or multi-core but also to the development of various applications, the required level of semiconductor memory systems is increasing in terms of reliability as well as performance.

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

A data storage device using a memory system is advantageous in that, since there is no mechanical driving part, stability and durability are excellent, an information access speed is very high, and power consumption is low. Data storage devices, as an example of the memory system having such advantages, include a universal serial bus (USB) memory device, memory cards having various interfaces, and a solid state drive (SSD).

SUMMARY

An embodiment of the present disclosure may provide for an internal voltage generation circuit. The internal voltage generation circuit may include an integration circuit configured to generate an initial voltage that increases with a constant slope based on an input voltage, a selection circuit configured to compare a feedback voltage with a reference voltage and then output the initial voltage or the reference voltage as an output voltage, and a first internal voltage generation circuit configured to generate an internal voltage by being supplied with an external supply voltage or by being blocked from being supplied with the external supply voltage based on a result of a comparison between the output voltage and the feedback voltage and to generate the feedback voltage by dividing the internal voltage.

An embodiment of the present disclosure may provide for an internal voltage generation circuit. The internal voltage generation circuit may include an integration circuit configured to generate an initial voltage that increases with a constant slope based on an input voltage, a first selection circuit configured to compare a first feedback voltage with a first reference voltage and then output the initial voltage or the first reference voltage as a first output voltage, a first internal voltage generation circuit configured to generate a first internal voltage by being supplied with an external supply voltage or by being blocked from being supplied with the external supply voltage based on a result of a comparison between the first output voltage and the first feedback voltage and to generate the first feedback voltage by dividing the first internal voltage, a second selection circuit configured to compare a second feedback voltage with a second reference voltage and output the initial voltage or the second reference voltage as a second output voltage, and a second internal voltage generation circuit configured to generate a second internal voltage by being supplied with the external supply voltage or by being blocked from being supplied with the external supply voltage based on a result of a comparison between the second output voltage and the second feedback voltage and to generate the second feedback voltage by dividing the second internal voltage.

An embodiment of the present disclosure may provide for a memory device. The memory device may include a power-on reset circuit configured to detect a potential level of an external supply voltage, and then generate and output a power-on reset signal, a reference voltage generation circuit configured to generate a reference voltage by being supplied with the external supply voltage, and an internal voltage generation circuit activated in response to the power-on reset signal, and configured to be supplied with the external supply voltage, increase a potential level of an internal voltage, and output a potential level-increased internal voltage based on a result of a comparison between an initial voltage that increases with a constant slope and a feedback voltage.

DETAILED DESCRIPTION

Figure 1:
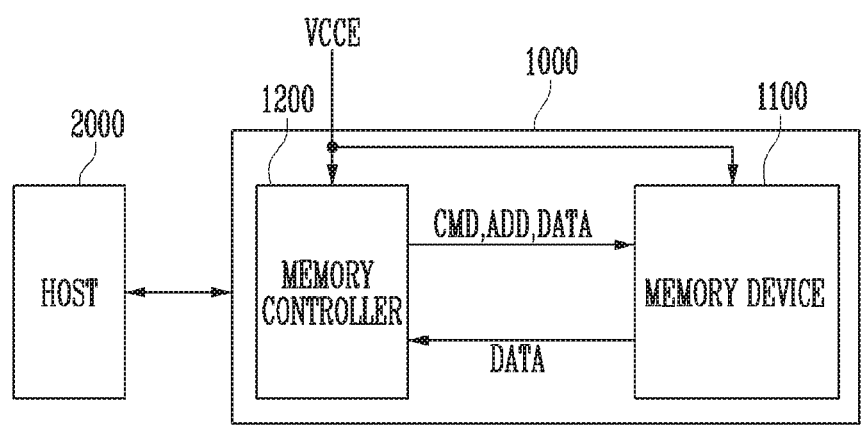
FIG. 1 is a block diagram illustrating a memory system according to an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will not be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

Various embodiments of the present disclosure may be directed to an internal voltage generation circuit that may be capable of suppressing the occurrence of a peak current during an internal voltage generation operation and to a memory device having the internal voltage generation circuit.

FIG. 1 is a block diagram illustrating a memory system according to an embodiment of the present disclosure.

Referring to FIG. 1, a memory system 1000 may include a memory device 1100 which stores data, and a memory controller 1200 which controls the memory device 1100 under the control of a host 2000.

The host 2000 is capable of communicating with the memory system 1000 using an interface protocol, such as Peripheral Component Interconnect-Express (PCI-E), Advanced Technology Attachment (ATA), Serial ATA (SATA), Parallel ATA (PATA) or Serial Attached SCSI (SAS). In addition, the interface protocol between the host 2000 and the memory system 1000 is not limited to the above-described examples, and may be one of various interface protocols, such as Universal Serial Bus (USB), Multi-Media Card (MMC), Enhanced Small Disk Interface (ESDI), and Integrated Drive Electronics (IDE) interface protocols.

The memory device 1100 is operated in response to the control of the memory controller 1200. In an embodiment, the memory device 1100 may be a flash memory device.

The memory device 1100 may receive a command CMD and an address ADD from the memory controller 1200 through a channel, and may access an area of a memory cell array selected by the address ADD. That is, the memory device 1100 may perform an internal operation corresponding to the command CMD on the area selected by the address ADD. For example, the memory device 1100 may perform a program operation on a selected block in response to the command CMD, the address ADD, and data which correspond to the program operation. Further, the memory device 1100 may perform a read operation on a selected memory block in response to a command CMD and an address ADD which correspond to a read operation, and may output the read data to the memory controller 1200.

The memory controller 1200 may control the overall operation of the memory system 1000, and may control data exchange between the host 2000 and the memory device 1100. For example, the memory controller 1200 may program or read data or may erase programmed data by controlling the memory device 1100 in response to a request received from the host 2000. For example, the memory controller 1200 may output a command CMD, an address ADD, and data DATA, which correspond to each overall operation, to the memory device 1100 in response to a request received from the host 2000, and may receive the data DATA from the memory device 1100 and output the data DATA to the host 2000.

The memory device 1100 and the memory controller 1200 may each be supplied with an external supply voltage VCCE and then be operated. For example, the memory device 1100 may be supplied with the external supply voltage VCCE to generate one or more internal voltages, and may perform the overall operation using the one or more internal voltages.

In an embodiment of the present disclosure, the memory system 1000 is illustrated and described as including a single memory device 1100, but the memory system 1000 may include a plurality of memory devices 1100. During a power-up interval of the memory system 1000, a plurality of memory devices 1100 may simultaneously generate one or more internal voltages using the external supply voltage VCCE, and thus a problem may arise in that instantaneous current consumption is increased by the operation of generating the internal voltages, thus causing a peak current to increase.

Figure 2:
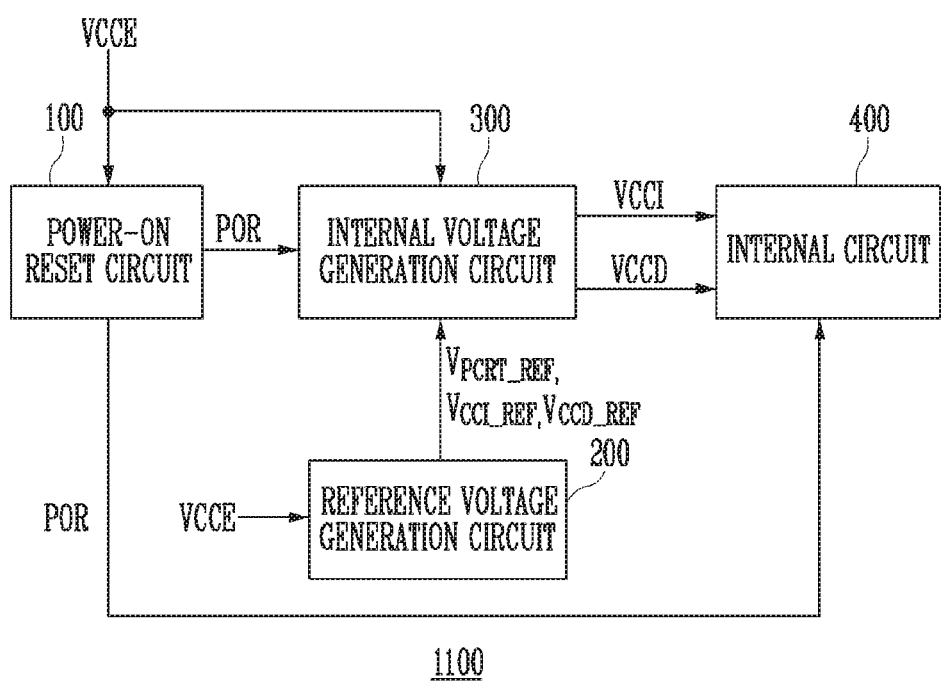
FIG. 2 is a block diagram illustrating a memory device according to an embodiment of the present disclosure.

FIG. 2 is a block diagram illustrating a memory device according to an embodiment of the present disclosure.

Referring to FIG. 2, the memory device 1100 may include a power-on reset circuit 100, a reference voltage generation circuit 200, an internal voltage generation circuit 300, and an internal circuit 400.

The power-on reset circuit 100 may detect the potential level of an external supply voltage VCCE, and then generate and output a power-on reset signal POR. For example, when the potential level of the external supply voltage VCCE increases to a preset level or more during the power-up operation of the memory system, the power-on reset circuit 100 may generate and output the power-on reset signal POR that is toggling.

The word "preset" as used herein with respect to a parameter, such as a preset level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The reference voltage generation circuit 200 may be supplied with the external supply voltage VCCE, and may then generate and output a first reference voltage $V_{PCRT\_REF}$, a second reference voltage $V_{CCI\_REF}$, and a third reference voltage $V_{CCD\_REF}$, each having a certain level.

The internal voltage generation circuit 300 may be activated in response to the power-on reset signal POR, and may be supplied with the external supply voltage VCCE, the first reference voltage $V_{PCRT\_REF}$, the second reference voltage $V_{CCI\_REF}$, and the third reference voltage $V_{CCD\_REF}$ to generate and output a first internal voltage VCCI and a second internal voltage VCCD.

The internal voltage generation circuit 300 according to an embodiment of the present disclosure may be operated when the external supply voltage VCCE increases to the preset level or greater in response to the power-on reset signal POR, and may suppress rapid current consumption by increasing the potential levels of the first internal voltage VCCI and the second internal voltage VCCD and by controlling the increasing speeds thereof during an initial generation interval.

The internal circuit 400 is initialized in response to the power-on reset signal POR output from the power-on reset circuit 100. Also, the internal circuit 400 is operated using the first internal voltage VCCI and the second internal voltage VCCD, which are generated by the internal voltage generation circuit 300, as supply powers, and performs the overall operation, such as a program operation of storing data, a read operation of reading stored data, and an erase operation of erasing stored data in response to commands, addresses, and data received from the memory controller 1200 of FIG. 1.

Figure 3:
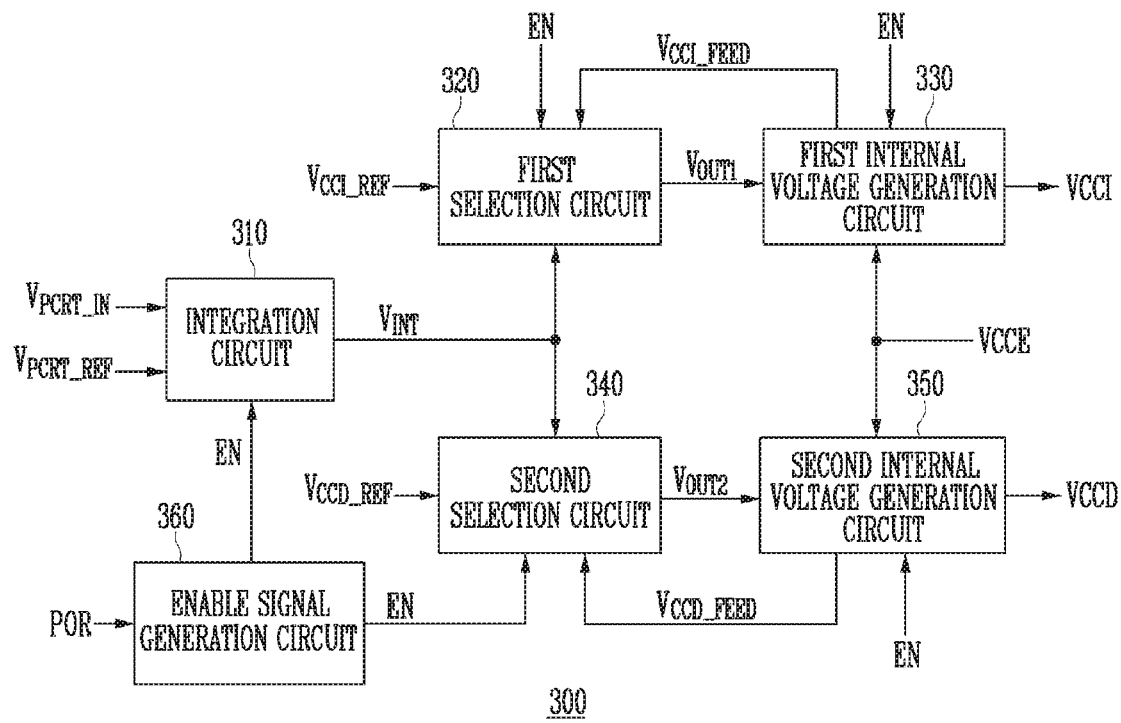
FIG. 3 is a block diagram illustrating an internal voltage generation circuit of FIG. 2.

FIG. 3 is a block diagram illustrating the internal voltage generation circuit of FIG. 2.

Referring to FIG. 3, the internal voltage generation circuit 300 may include an integration circuit 310, a first selection circuit 320, a first internal voltage generation circuit 330, a second selection circuit 340, a second internal voltage generation circuit 350, and an enable signal generation circuit 360.

The enable signal generation circuit 360 generates an enable signal EN in response to a power-on reset signal POR, and outputs the generated enable signal EN to the integration circuit 310, the first selection circuit 320, the first internal voltage generation circuit 330, the second selection circuit 340, and the second internal voltage generation circuit 350. For example, the enable signal generation circuit 360 may generate and output the enable signal EN which is activated at a time point at which the power-on reset signal POR makes a transition to a low level after having increased to a high level.

The integration circuit 310 may be activated in response to the enable signal EN, and may generate and output an initial voltage $V_{INT}$ that increases with a constant slope in response to an input voltage $V_{PCRT\_IN}$ and a first reference voltage $V_{PCRT\_REF}$. The integration circuit 310 may generate the initial voltage $V_{INT}$ by integrating a value feedback to the initial voltage $V_{INT}$, which is obtained by dividing a difference between the input voltage $V_{PCR\_IN}$ and the first reference voltage $V_{PCRT\_REF}$ by a preset resistance value.

The first selection circuit 320 may be activated in response to the enable signal EN, and may be configured to compare a second reference voltage $V_{CCI\_REF}$ with a first feedback voltage $V_{CCI\_FEED}$ output from the first internal voltage generation circuit 330, select any one of the initial voltage $V_{INT}$ and the second reference voltage $V_{CCI\_REF}$ based on the result of the comparison, and output the selected voltage as a first output voltage $V_{OUT1}$. For example, when the potential level of the second reference voltage $V_{CCI\_REF}$ is higher than that of the first feedback voltage $V_{CCI\_FEED}$, the first selection circuit 320 may output the initial voltage $V_{INT}$ as the first output voltage $V_{OUT1}$, whereas when the potential level of the second reference voltage $V_{CCI\_REF}$ is lower than that of the first feedback voltage $V_{CCI\_FEED}$, the first selection circuit 320 may output the second reference voltage $V_{CCI\_REF}$ as the first output voltage $V_{OUT1}$. During an initial generation interval in which the potential level of the second reference voltage $V_{CCI\_REF}$ is higher than that of the first feedback voltage $V_{CCI\_FEED}$, the initial voltage $V_{INT}$ may have a potential level lower than that of the second reference voltage $V_{CCI\_REF}$.

The first internal voltage generation circuit 330 may be activated in response to the enable signal EN, and may generate and output a first internal voltage VCCI by controlling the amount of supply current from the external supply voltage VCCE depending on the first output voltage $V_{OUT1}$. Further, the first internal voltage generation circuit 330 may generate the first feedback voltage $V_{CCI\_FEED}$ by dividing the first internal voltage VCCI.

During the initial generation interval in which the potential level of the second reference voltage $V_{CCI\_REF}$ is higher than that of the first feedback voltage $V_{CCI\_FEED}$, the first internal voltage generation circuit 330 may receive the initial voltage $V_{INT}$, which is lower than the second reference voltage $V_{CCI\_REF}$ and increases with a constant slope, as the first output voltage $V_{OUT1}$, and may then generate the first internal voltage VCCI. In this way, the first internal voltage generation circuit 330 may control the speed, at which the first internal voltage VCCI increases, to a low speed during the initial generation interval, thus reducing current consumption.

The second selection circuit 340 may be activated in response to the enable signal EN, and may be configured to compare a third reference voltage $V_{CCD\_REF}$ with a second feedback voltage $V_{CCD\_FEED}$ output from the second internal voltage generation circuit 350, select any one of the initial voltage $V_{INT}$ and the third reference voltage $V_{CCD\_REF}$ based on the result of the comparison, and output the selected voltage as a second output voltage $V_{OUT2}$. For example, when the potential level of the third reference voltage $V_{CCD\_REF}$ is higher than that of the second feedback voltage $V_{CCD\_FEED}$, the second selection circuit 340 may output the initial voltage $V_{INT}$ as the second output voltage $V_{OUT2}$, whereas when the potential level of the third reference voltage $V_{CCD\_REF}$ is lower than that of the second feedback voltage $V_{CCD\_FEED}$, the second selection circuit 340 may output the third reference voltage $V_{CCD\_REF}$ as the second output voltage $V_{OUT2}$. During the initial generation interval in which the potential level of the third reference voltage $V_{CCD\_REF}$ is higher than that of the second feedback voltage $V_{CCD\_FEED}$, the initial voltage $V_{INT}$ may have a potential level lower than that of the third reference voltage $V_{CCD\_REF}$.

The second internal voltage generation circuit 350 may be activated in response to the enable signal EN, and may generate and output a second internal voltage VCCD by controlling the amount of supply current from the external supply voltage VCCE depending on the second output voltage $V_{OUT2}$. Furthermore, the second internal voltage generation circuit 350 may generate the second feedback voltage $V_{CCD\_FEED}$ by dividing the second internal voltage VCCD.

During the initial generation interval in which the potential level of the third reference voltage $V_{CCD\_REF}$ is higher than that of the second feedback voltage $V_{CCD\_FEED}$, the second internal voltage generation circuit 350 may receive the initial voltage $V_{INT}$, which is lower than the third reference voltage $V_{CCD\_REF}$ and increases with a constant slope, as the second output voltage $V_{OUT2}$, and may then generate the second internal voltage VCCD. In this way, the second internal voltage generation circuit 350 may control the speed, at which the second internal voltage VCCD increases, to a low speed during the initial generation interval, thus reducing current consumption.

Figure 4:
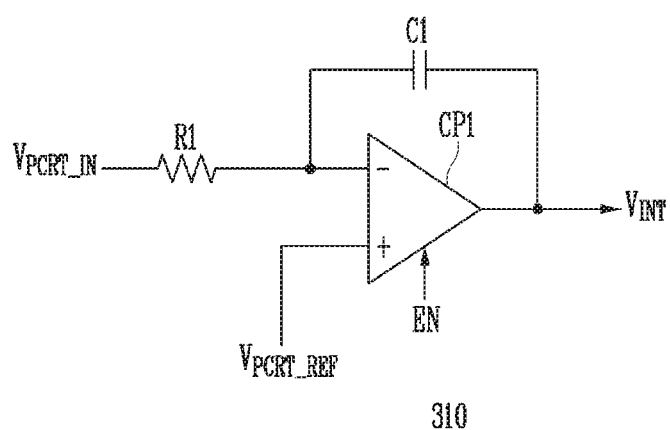
FIG. 4 is a circuit diagram illustrating an integration circuit of FIG. 3.

FIG. 4 is a circuit diagram illustrating the integration circuit of FIG. 3.

Referring to FIG. 4, the integration circuit 310 may include a resistor R1, a capacitor C1, and an amplifier CP1.

The resistor R1 receives an input voltage $V_{PCRT\_IN}$, and then outputs the input voltage $V_{PCRT\_IN}$ to a first input terminal (−) of the amplifier CP1. The capacitor C1 is coupled between the first input terminal (−) and an output terminal of the amplifier CP1. A first reference voltage $V_{PCRT\_REF}$ is input to a second input terminal (+) of the amplifier CP1. The first reference voltage $V_{PCRT\_REF}$ may be a ground voltage. The amplifier CP1 may be implemented, for example, as an operational amplifier (OP Amp). In some embodiments, the integration circuit 310 may be implemented as an operational amplifier connected in an amplifier configuration.

The integration circuit 310 generates and outputs the initial voltage $V_{INT}$ by integrating the input voltage $V_{PCRT\_IN}$ with the closed-loop voltage gain of the integration circuit 310. For example, the integration circuit 310 may receive the input voltage $V_{PCRT\_IN}$ having a predetermined level, and may generate and output the initial voltage $V_{INT}$ which increases with a constant slope.

Figure 5:
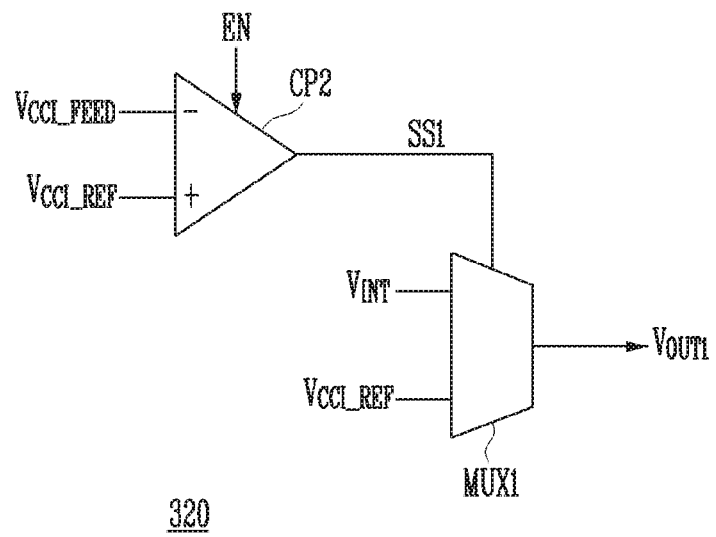
FIG. 5 is a circuit diagram illustrating a first selection circuit of FIG. 3.

FIG. 5 is a circuit diagram illustrating the first selection circuit of FIG. 3.

Referring to FIG. 5, the first selection circuit 320 may include a comparator CP2 and a multiplexer MUX1.

The comparator CP2 may be activated in response to an enable signal EN, and may be configured to receive a first feedback voltage $V_{CCI\_FEED}$ and a second reference voltage $V_{CCI\_REF}$, compare the first feedback voltage $V_{CCI\_FEED}$ with the second reference voltage $V_{CCI\_REF}$, and then generate and output a first selection signal SS1 based on the result of the comparison. For example, when the potential level of the first feedback voltage $V_{CCI\_FEED}$ is higher than that of the second reference voltage $V_{CCI\_REF}$, the comparator CP2 may generate and output a first selection signal SS1 having a first logic level (e.g., low level), whereas when the potential level of the first feedback voltage $V_{CCI\_FEED}$ is lower than that of the second reference voltage $V_{CCI\_REF}$, the comparator CP2 may generate and output a first selection signal SS1 having a second logic level (e.g., high level).

The multiplexer MUX1 may receive the initial voltage $V_{INT}$ and the second reference voltage $V_{CCI\_REF}$, select any one of the initial voltage $V_{INT}$ and the second reference voltage $V_{CCI\_REF}$ in response to the first selection signal SS1, and output the selected voltage as a first output voltage $V_{OUT1}$. For example, when the first selection signal SS1 has the first logic level, the multiplexer MUX1 may select the second reference voltage $V_{CCI\_REF}$ and output the selected voltage as the first output voltage $V_{OUT1}$, whereas when the first selection signal SS1 has the second logic level, the multiplexer MUX1 may select the initial voltage $V_{INT}$ and output the selected voltage as the first output voltage $V_{OUT1}$.

That is, when the potential level of the second reference voltage $V_{CCI\_REF}$ is higher than that of the first feedback voltage $V_{CCI\_FEED}$, the first selection circuit 320 may output the initial voltage $V_{INT}$ as the first output voltage $V_{OUT1}$, whereas when the potential level of the second reference voltage $V_{CCI\_REF}$ is lower than that of the first feedback voltage $V_{CCI\_FEED}$, the first selection circuit 320 may output the second reference voltage $V_{CCI\_REF}$ as the first output voltage $V_{OUT1}$.

Figure 6:
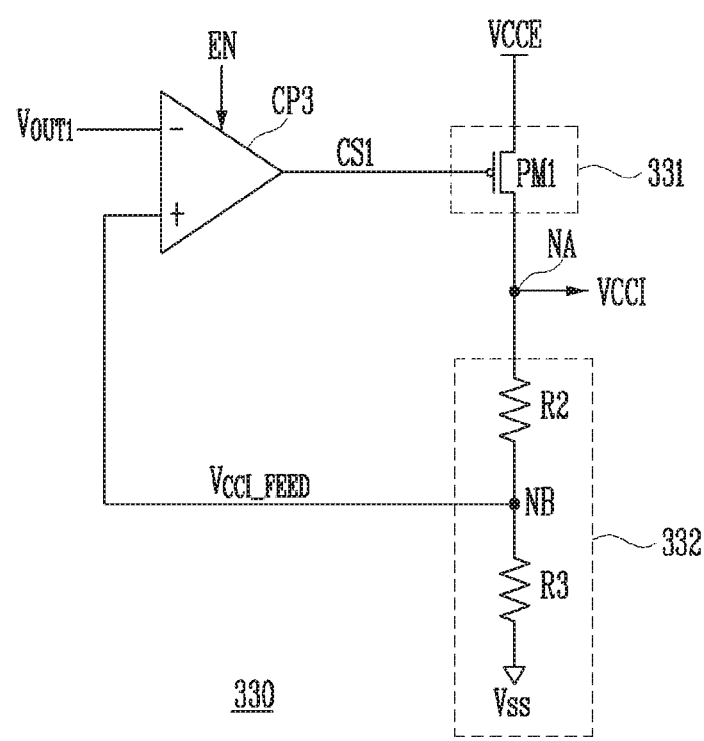
FIG. 6 is a circuit diagram illustrating a first internal voltage generation circuit of FIG. 3.

FIG. 6 is a circuit diagram illustrating the first internal voltage generation circuit of FIG. 3.

The first internal voltage generation circuit 330 may include an amplifier CP3, a current supply circuit 331, and a voltage division circuit 332.

The amplifier CP3 may be activated in response to an enable signal EN, and may be configured to compare a first output voltage $V_{OUT1}$ with a first feedback voltage $V_{CCI\_FEED}$ output from the voltage division circuit 332, and then generate and output a first control signal CS1. For example, when the potential level of the first output voltage $V_{OUT1}$ is higher than that of the first feedback voltage $V_{CCI\_FEED}$, the amplifier CP3 may generate and output the first control signal CS1 having a first logic level (e.g., low level), whereas when the potential level of the first output voltage $V_{OUT1}$ is lower than that of the first feedback voltage $V_{CCI\_FEED}$, the amplifier CP3 may generate and output the first control signal CS1 having a second logic level (e.g., high level).

The current supply circuit 331 may apply an external supply voltage VCCE to an output node NA or block the application of the external supply voltage VCCE thereto in response to the first control signal CS1. For example, the current supply circuit 331 may be implemented as a PMOS transistor PM1 coupled between a terminal to which the external supply voltage VCCE is applied and the output node NA. The PMOS transistor PM1 is turned on or off in response to the first control signal CS1, thus applying the external supply voltage VCCE to the output node NA or blocking the application of the external supply voltage VCCE thereto.

The voltage division circuit 332 is coupled between the output node NA and a ground power terminal Vss. The voltage division circuit 332 generates the first feedback voltage $V_{CCI\_FEED}$ by dividing the potential of the output node NA, that is, the first internal voltage VCCI. For example, the voltage division circuit 332 may include first and second resistors R2 and R3 coupled in series between the output node NA and the ground power terminal Vss. The voltage division circuit 332 may divide the first internal voltage VCCI depending on the ratio of the resistances of the first and second resistors R2 and R3, and may then output the first feedback voltage $V_{CCI\_FEED}$ through a node NB between the first and second resistors R2 and R3.

When the potential level of the first internal voltage VCCI generated by the first internal voltage generation circuit 330 is lower than a target potential level, the first feedback voltage $V_{CCI\_FEED}$, generated by dividing the first internal voltage VCCI, has a potential level lower than that of the first output voltage $V_{OUT1}$. Due thereto, the amplifier CP3 outputs the first control signal CS1 having a first logic level, and the current supply circuit 331 applies the external supply voltage VCCE to the output node NA in response to the first control signal CS1, thus increasing the potential level of the first internal voltage VCCI. When the potential level of the first internal voltage VCCI is higher than the target potential level, the first feedback voltage $V_{CCI\_FEED}$, which is generated by dividing the first internal voltage VCCI, has a potential level higher than that of the first output voltage $V_{OUT1}$. Due thereto, the amplifier CP3 outputs the first control signal CS1 having a second logic level, and the current supply circuit 331 blocks the application of the external supply voltage VCCE to the output node NA in response to the first control signal CS1. As a result, the potential level of the first internal voltage VCCI does not increase any more, and is maintained at a constant level.

Figure 7:
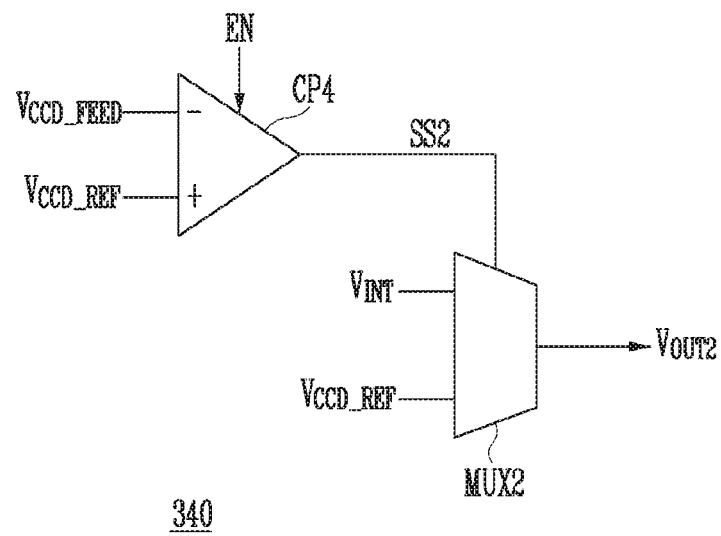
FIG. 7 is a circuit diagram illustrating a second selection circuit of FIG. 3.

FIG. 7 is a circuit diagram illustrating the second selection circuit of FIG. 3.

Referring to FIG. 7, the second selection circuit 340 may include a comparator CP4 and a multiplexer MUX2.

The comparator CP4 may be activated in response to an enable signal EN, and may be configured to receive a second feedback voltage $V_{CCD\_FEED}$ and a third reference voltage $V_{CCD\_REF}$, compare the second feedback voltage $V_{CCD\_FEED}$ with the third reference voltage $V_{CCD\_REF}$, and may generate and output a second selection signal SS2 based on the result of the comparison. For example, when the potential level of the second feedback voltage $V_{CCD\_FEED}$ is higher than that of the third reference voltage $V_{CCD\_REF}$, the comparator CP4 may generate and output a second selection signal SS2 having a first logic level (e.g., low level), whereas when the potential level of the second feedback voltage $V_{CCD\_FEED}$ is lower than that of the third reference voltage $V_{CCD\_REF}$, the comparator CP4 may generate and output the second selection signal SS2 having a second logic level (e.g., high level).

The multiplexer MUX2 may receive the initial voltage $V_{INT}$ and the third reference voltage $V_{CCD\_REF}$, select any one of the initial voltage $V_{INT}$ and the third reference voltage $V_{CCD\_REF}$ in response to the second selection signal SS2, and output the selected voltage as a second output voltage $V_{OUT2}$. For example, when the second selection signal SS2 has a first logic level, the multiplexer MUX2 may select the third reference voltage $V_{CCD\_REF}$ and output the selected voltage as the second output voltage $V_{OUT2}$, whereas when the second selection signal SS2 has a second logic level, the multiplexer MUX2 may select the initial voltage $V_{INT}$ and output the selected voltage as the second output voltage $V_{OUT2}$.

For example, when the potential level of the third reference voltage $V_{CCD\_REF}$ is higher than that of the second feedback voltage $V_{CCD\_FEED}$, the second selection circuit 340 may output the initial voltage $V_{INT}$ as the second output voltage $V_{OUT2}$, whereas when the potential level of the third reference voltage $V_{CCD\_REF}$ is lower than that of the second feedback voltage $V_{CCD\_FEED}$, the second selection circuit 340 may output the third reference voltage $V_{CCD\_REF}$ as the second output voltage $V_{OUT2}$.

Figure 8:
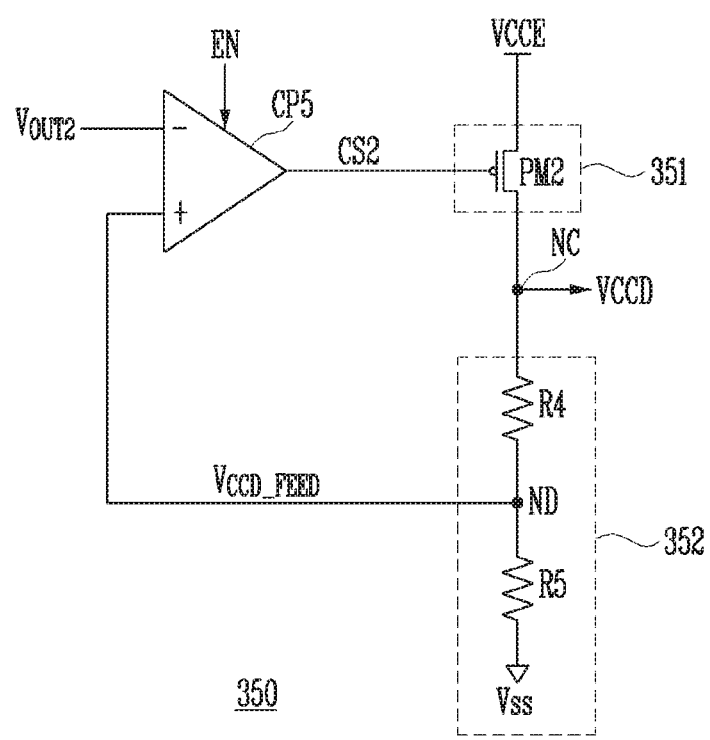
FIG. 8 is a circuit diagram illustrating a second internal voltage generation circuit of FIG. 3.

FIG. 8 is a circuit diagram illustrating the second internal voltage generation circuit of FIG. 3.

The second internal voltage generation circuit 350 may include an amplifier CP5, a current supply circuit 351, and a voltage division circuit 352.

The amplifier CP5 may be activated in response to an enable signal EN, and may be configured to compare a second output voltage $V_{OUT2}$ with a second feedback voltage $V_{CCD\_FEED}$ output from the voltage division circuit 352, and then generate and output a second control signal CS2. For example, when the potential level of the second output voltage $V_{OUT2}$ is higher than that of the second feedback voltage $V_{CCD\_FEED}$, the amplifier CP5 may generate and output the second control signal CS2 having a first logic level (e.g., low level), whereas when the potential level of the second output voltage $V_{OUT2}$ is lower than that of the second feedback voltage $V_{CCD\_FEED}$, the amplifier CP5 may generate and output the second control signal CS2 having a second logic level (e.g., high level).

The current supply circuit 351 may apply an external supply voltage VCCE to an output node NC or block the application of the external supply voltage VCCE thereto in response to the second control signal CS2. For example, the current supply circuit 351 may be implemented as a PMOS transistor PM2 coupled between a terminal to which the external supply voltage VCCE is applied and the output node NC. The PMOS transistor PM2 is turned on or off in response to the second control signal CS2, thus applying the external supply voltage VCCE to the output node NC or blocking the application of the external supply voltage VCCE thereto.

The voltage division circuit 352 is coupled between the output node NC and a ground power terminal Vss. The voltage division circuit 352 generates the second feedback voltage $V_{CCD\_FEED}$ by dividing the potential of the output node NC, that is, the second internal voltage VCCD. For example, the voltage division circuit 352 may include first and second resistors R4 and R5 coupled in series between the output node NC and the ground power terminal Vss. The voltage division circuit 352 may divide the second internal voltage VCCD depending on the ratio of the resistances of the first and second resistors R4 and R5, and may then output the second feedback voltage $V_{CCD\_FEED}$ through a node ND between the first and second resistors R4 and R5.

When the potential level of the second internal voltage VCCD generated by the second internal voltage generation circuit 350 is lower than a target potential level, the second feedback voltage $V_{CCD\_FEED}$, generated by dividing the second internal voltage VCCD, has a potential level lower than that of the second output voltage $V_{OUT2}$. Due thereto, the amplifier CP5 outputs the second control signal CS2 having a first logic level, and the current supply circuit 351 applies the external supply voltage VCCE to the output node NC in response to the second control signal CS2, thus increasing the potential level of the second internal voltage VCCD. When the potential level of the second internal voltage VCCD is higher than the target potential level, the second feedback voltage $V_{CCD\_FEED}$, which is generated by dividing the second internal voltage VCCD, has a potential level higher than that of the second output voltage $V_{OUT2}$. Due thereto, the amplifier CP5 outputs the second control signal CS2 having a second logic level, and the current supply circuit 351 blocks the application of the external supply voltage VCCE to the output node NC in response to the second control signal CS2. As a result, the potential level of the second internal voltage VCCD does not increase any more, and is maintained at a constant level.

Figure 9:
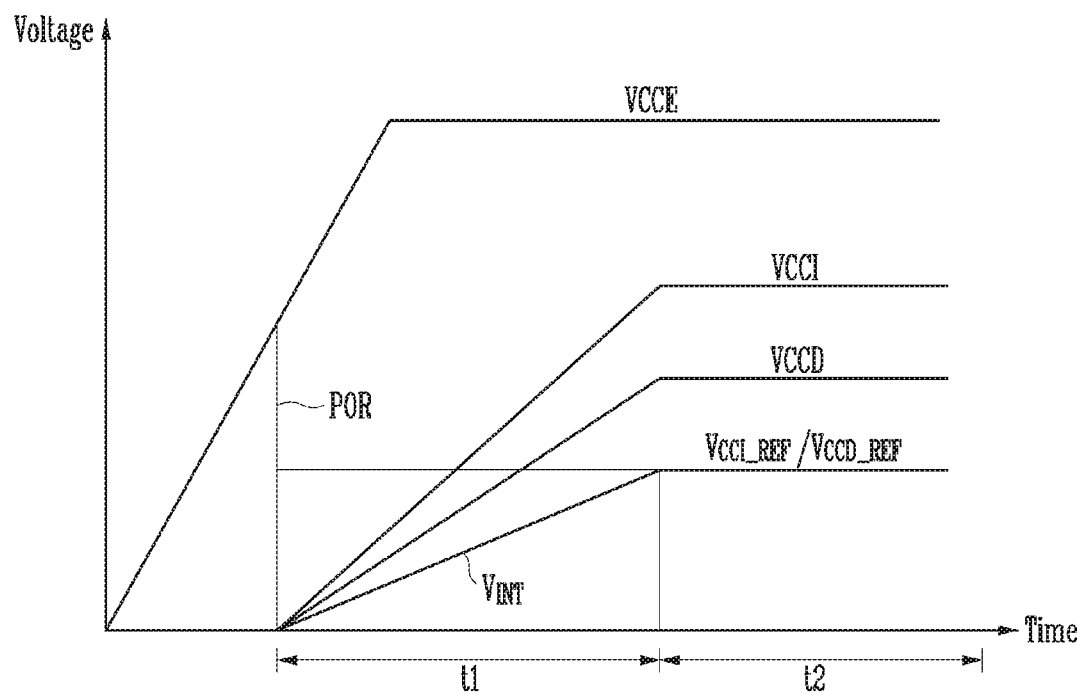
FIG. 9 is a voltage waveform diagram illustrating the operation of an internal voltage generation circuit according to an embodiment of the present disclosure.

FIG. 9 is a voltage waveform diagram illustrating the operation of an internal voltage generation circuit according to an embodiment of the present disclosure.

The operation of a memory device according to an embodiment of the present disclosure will be described below with reference to FIGS. 2 to 9.

For example, when the potential level of an external supply voltage VCCE increases to a preset level or more during a power-up operation of a memory system, the power-on reset circuit 100 may generate and output a power-on reset signal POR that is toggling. That is, the power-on reset signal POR increases with an increase in the external supply voltage VCCE, and then makes a transition to a low level when the external supply voltage VCCE increases to the preset level or more.

The reference voltage generation circuit 200 is supplied with the external supply voltage VCCE to generate and output a first reference voltage $V_{PCRT\_REF}$, a second reference voltage $V_{CCI\_REF}$, and a third reference voltage $V_{CCD\_REF}$, each having a certain level.

The enable signal generation circuit 360 of the internal voltage generation circuit 300 may generate an enable signal EN in response to the power-on reset signal POR, and may output the generated enable signal EN to the integration circuit 310, the first selection circuit 320, the first internal voltage generation circuit 330, the second selection circuit 340, and the second internal voltage generation circuit 350. For example, the enable signal generation circuit 360 generates and outputs the enable signal EN which is activated at a time point at which the power-on reset signal POR makes a transition to a low level after having increased to a high level.

The integration circuit 310 may be activated in response to the enable signal EN, and may generate an initial voltage $V_{INT}$ by integrating a value, which is obtained by dividing a difference between an input voltage $V_{PCRT\_IN}$ and the first reference voltage $V_{PCRT\_REF}$ by a preset resistance value (e.g., the resistance value of the resistor R1 of FIG. 4), with the initial voltage $V_{INT}$. The initial voltage $V_{INT}$ is a voltage that increases with a constant slope.

The first selection circuit 320 may be activated in response to the enable signal EN, and may be configured to compare a second reference voltage $V_{CCI\_REF}$ with a first feedback voltage $V_{CCI\_FEED}$ output from the first internal voltage generation circuit 330, select any one of the initial voltage $V_{INT}$ and the second reference voltage $V_{CCI\_REF}$ based on the result of the comparison, and output the selected voltage as a first output voltage $V_{OUT1}$. During an initial generation interval t1 in which the potential level of the second reference voltage $V_{CCI\_REF}$ is higher than that of the second feedback voltage $V_{CCD\_FEED}$, the first selection circuit 320 outputs the initial voltage $V_{INT}$ as the first output voltage $V_{OUT1}$.

The first internal voltage generation circuit 330 may be activated in response to the enable signal EN, and may be configured to receive the initial voltage $V_{INT}$ as the first output voltage $V_{OUT1}$ and to generate and output a first internal voltage VCCI by controlling the amount of supply current from the external supply voltage VCCE based on the result of a comparison between the first output voltage $V_{OUT1}$ and the first feedback voltage $V_{CCI\_FEED}$ during the initial generation interval t1. Due thereto, the first internal voltage generation circuit 330 may receive the initial voltage $V_{INT}$, which has a constant slope and is lower than the second reference voltage $V_{CCI\_REF}$, as the first output voltage $V_{OUT1}$ during the initial generation interval t1, thus slowly increasing the first internal voltage VCCI when the operation of generating the first internal voltage VCCI is performed. As a result, the first internal voltage generation circuit 330 may slowly increase the first internal voltage VCCI during the initial generation interval t1 in which the first internal voltage VCCI increases to a target level, thus reducing current consumption.

When the first internal voltage VCCI increases to the target level, the potential level of the first feedback voltage $V_{CCI\_FEED}$ is higher than that of the second reference voltage $V_{CCI\_REF}$, and the first selection circuit 320 outputs the second reference voltage $V_{CCI\_REF}$ as the first output voltage $V_{OUT1}$.

The first internal voltage generation circuit 330 may receive the second reference voltage $V_{CCI\_REF}$ as the first output voltage $V_{OUT1}$ during an interval t2, and may output the first internal voltage VCCI at a constant level by controlling the amount of supply current from the external supply voltage VCCE based on the result of a comparison between the first output voltage $V_{OUT1}$ and the first feedback voltage $V_{CCI\_FEED}$.

In an above-described embodiment, an example in which the first internal voltage VCCI is generated has been described, and the operation of generating the second internal voltage VCCD is similar to the above-described operation of generating the first internal voltage, and thus a detailed description thereof will be omitted.

The internal circuit 400 performs the overall operation, such as a program operation, a read operation or an erase operation, by using the first internal voltage VCCI and the second internal voltage VCCD generated by the internal voltage generation circuit 300, as supply powers.

Figure 10:
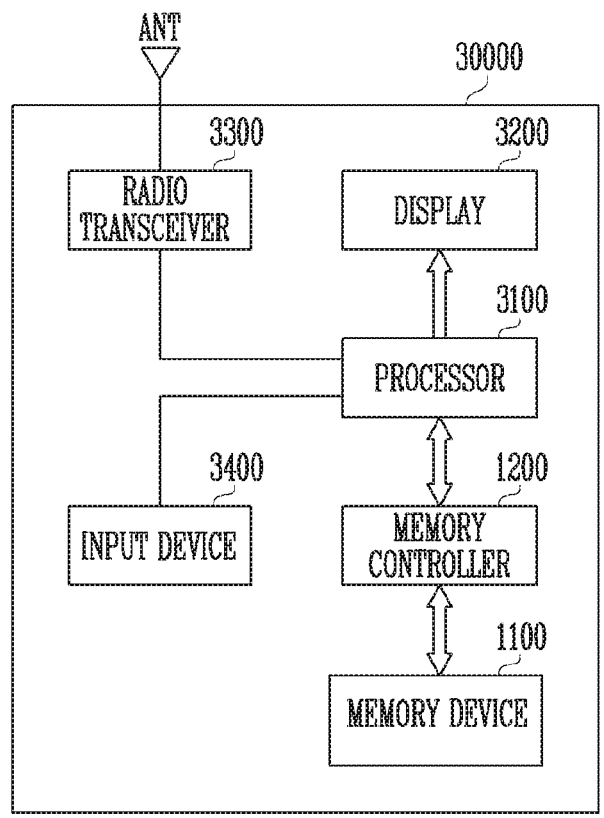
FIG. 10 is a diagram illustrating an embodiment of a memory system.

FIG. 10 is a diagram illustrating an embodiment of a memory system.

Referring to FIG. 10, a memory system 30000 may be implemented as a cellular phone, a smart phone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation for the memory device 1100, for example, a program operation, an erase operation or a read operation under the control of a processor 3100.

Data programmed to the memory device 1100 may be outputted via a display 3200 under the control of the memory controller 1200.

A radio transceiver 3300 may exchange radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program the signal processed by the processor 3100 to the memory device 1100. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 1200, data outputted from the radio transceiver 3300, or data outputted from the input device 3400 is outputted via the display 3200.

In an embodiment, the memory controller 1200 capable of controlling the operation of the memory device 1100 may be implemented as a part of the processor 3100 or a chip provided separately from the processor 3100. Further, the memory controller 1200 may be implemented through an example of the memory controller discussed with regard to FIGS. 1-9, and the memory device 1100 may be implemented through an example of the memory device discussed with regard to FIGS. 1-9.

Figure 11:
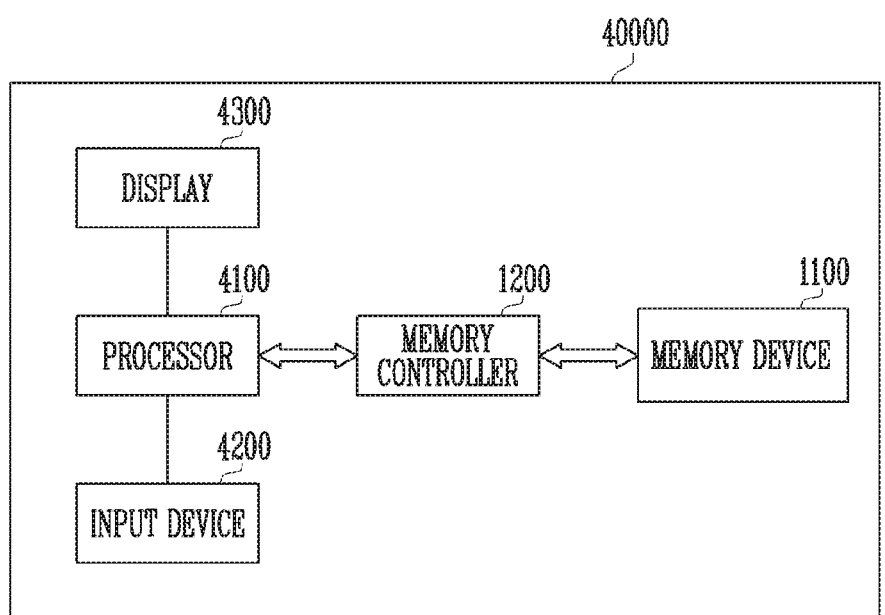
FIG. 11 is a diagram illustrating an embodiment of a memory system.

FIG. 11 is a diagram illustrating an embodiment of a memory system.

Referring to FIG. 11, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device 1100.

A processor 4100 may output data stored in the memory device 1100 via a display 4300 according to data inputted from an input device 4200. For example, the input device 4200 may be implemented as a pointing device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100. Further, the memory controller 1200 may be implemented through an example of the memory controller discussed with regard to FIGS. 1-9, and the memory device 1100 may be implemented through an example of the memory device discussed with regard to FIGS. 1-9.

Figure 12:
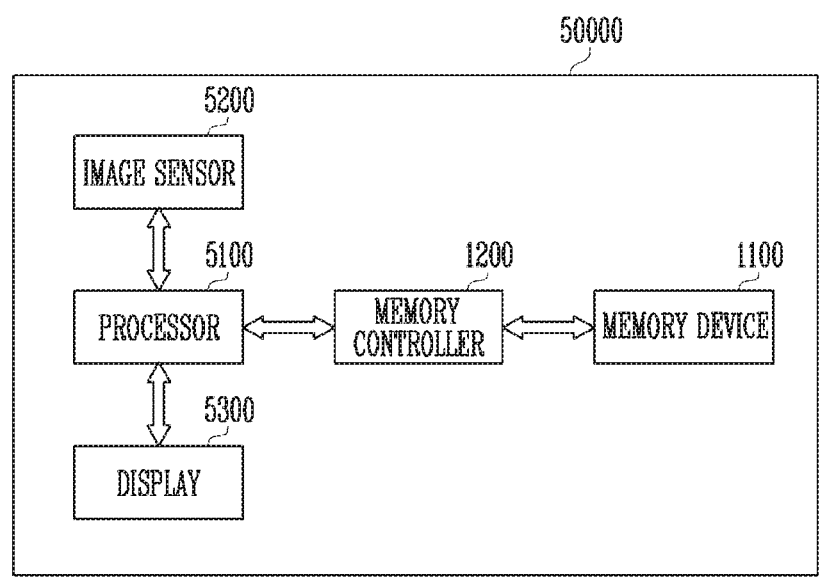
FIG. 12 is a diagram illustrating an embodiment of a memory system.

FIG. 12 is a diagram illustrating an embodiment of a memory system.

Referring to FIG. 12, a memory system 50000 may be embodied in an image processing device, e.g., a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation of the memory device 1100, e.g., a program operation, an erase operation or a read operation.

An image sensor 5200 of the memory system 50000 may convert an optical image into digital signals. The converted digital signals may be transmitted to a processor 5100 or the memory controller 1200. Under the control of the processor 5100, the converted digital signals may be outputted via a display 5300 or stored in the memory device 1100 through the memory controller 1200. Data stored in the memory device 1100 may be outputted via the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100. Further, the memory controller 1200 may be implemented through an example of the memory controller discussed with regard to FIGS. 1-9, and the memory device 1100 may be implemented through an example of the memory device discussed with regard to FIGS. 1-9.

Figure 13:
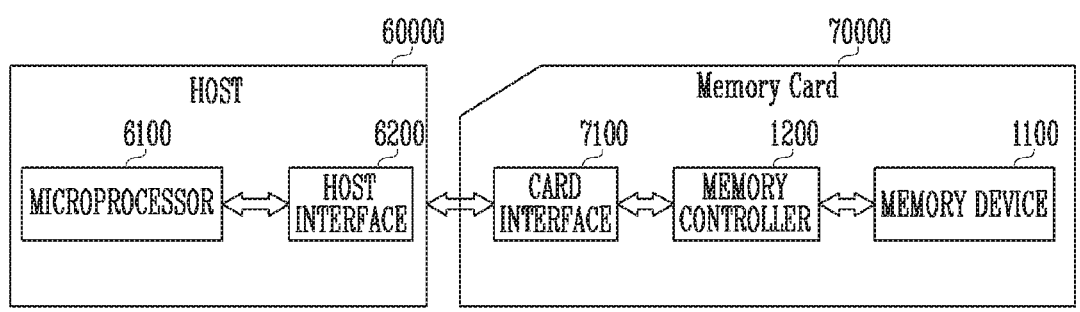
FIG. 13 is a diagram illustrating an embodiment of a memory system.

FIG. 13 is a diagram illustrating an embodiment of a memory system.

Referring to FIG. 13, a memory system 70000 may be embodied in a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface.

The card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface may refer to hardware capable of supporting a protocol which is used by the host 60000, software installed in the hardware, or a signal transmission method.

When the memory system 70000 is coupled to a host interface 6200 of the host 60000, such as a PC, a tablet PC, a digital camera, a digital audio player, a mobile phone, console video game hardware or a digital set-top box, the host interface 6200 may perform data communication with the memory device 1100 through the card interface 7100 and the memory controller 1200 under the control of a microprocessor 6100. Further, the memory controller 1200 may be implemented through an example of the memory controller discussed with regard to FIGS. 1-9, and the memory device 1100 may be implemented through an example of the memory device discussed with regard to FIGS. 1-9.

While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be sequentially performed, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

In accordance with the present disclosure, a voltage generation circuit may be operated using a voltage increasing with a constant slope during an initial operation of internal voltage generation, thus suppressing the generation of a peak current caused by the voltage generation circuit.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic concepts described herein will still fall within the spirit and scope of the present disclosure as defined in the appended claims and their equivalents.

What is claimed is:

1. An internal voltage generation circuit, comprising:
   an integration circuit configured to generate an initial voltage that increases with a constant slope based on an input voltage;
   a first selection circuit configured to compare a first feedback voltage with a first reference voltage and then output the initial voltage or the first reference voltage as a first output voltage; and
   a first internal voltage generation circuit configured to generate a first internal voltage by being supplied with an external supply voltage or by being blocked from being supplied with the external supply voltage based on a result of a comparison between the first output voltage and the first feedback voltage and to generate the first feedback voltage by dividing the first internal voltage.

2. The internal voltage generation circuit according to claim 1, wherein the first selection circuit comprises:
   a comparator configured to generate a selection signal by comparing the first feedback voltage with the first reference voltage; and
   a multiplexer configured to receive the initial voltage and the first reference voltage, select any one of the initial voltage and the first reference voltage in response to the selection signal, and output the selected voltage as the first output voltage.

3. The internal voltage generation circuit according to claim 1, wherein the first selection circuit outputs the initial voltage as the first output voltage during an initial generation interval in which the first feedback voltage is lower than the first reference voltage, and outputs the first reference voltage as the first output voltage during an operation interval subsequent to the initial generation interval.

4. The internal voltage generation circuit according to claim 2, wherein the initial voltage has a potential level lower than that of the first reference voltage during the initial generation interval.

5. The internal voltage generation circuit according to claim 2, wherein the first internal voltage generation circuit receives the initial voltage as the first output voltage during the initial generation interval, compares the initial voltage with the first feedback voltage, and then increases a potential level of the first internal voltage.

6. The internal voltage generation circuit according to claim 1, further comprising an enable signal generation circuit configured to generate an enable signal for activating the integration circuit, the first selection circuit, and the first internal voltage generation circuit in response to a power-on reset signal, a logic level of which makes a transition when the external supply voltage increases to a preset level or greater.

7. An internal voltage generation circuit, comprising:
   an integration circuit configured to generate an initial voltage that increases with a constant slope based on an input voltage;
   a first selection circuit configured to compare a first feedback voltage with a first reference voltage and then output the initial voltage or the first reference voltage as a first output voltage;
   a first internal voltage generation circuit configured to generate a first internal voltage by being supplied with an external supply voltage or by being blocked from being supplied with the external supply voltage based on a result of a comparison between the first output voltage and the first feedback voltage and to generate the first feedback voltage by dividing the first internal voltage;
   a second selection circuit configured to compare a second feedback voltage with a second reference voltage and output the initial voltage or the second reference voltage as a second output voltage; and
   a second internal voltage generation circuit configured to generate a second internal voltage by being supplied with the external supply voltage or by being blocked from being supplied with the external supply voltage based on a result of a comparison between the second output voltage and the second feedback voltage and to generate the second feedback voltage by dividing the second internal voltage.

8. The internal voltage generation circuit according to claim 7, wherein the first selection circuit outputs the initial voltage as the first output voltage during an initial generation interval in which the first feedback voltage is lower than the first reference voltage, and outputs the first reference voltage as the first output voltage during an operation interval subsequent to the initial generation interval.

9. The internal voltage generation circuit according to claim 8, wherein the initial voltage has a potential level lower than that of the first reference voltage during the initial generation interval.

10. The internal voltage generation circuit according to claim 8, wherein the first voltage generation circuit receives the initial voltage as the first output voltage during the initial generation interval, compares the initial voltage with the first feedback voltage, and then increases a potential level of the first internal voltage.

11. The internal voltage generation circuit according to claim 7, wherein the second selection circuit outputs the initial voltage as the second output voltage during an initial generation interval in which the second feedback voltage is lower than the second reference voltage, and outputs the second reference voltage as the second output voltage during an operation interval subsequent to the initial generation interval.

12. The internal voltage generation circuit according to claim 11, wherein the initial voltage has a potential level lower than that of the second reference voltage during the initial generation interval.

13. The internal voltage generation circuit according to claim 12, wherein the second voltage generation circuit receives the initial voltage as the second output voltage during the initial generation interval, compares the initial voltage with the second feedback voltage, and then increases a potential level of the second internal voltage.

14. The internal voltage generation circuit according to claim 7,
wherein the first selection circuit comprises:
a comparator configured to generate a selection signal by comparing the first feedback voltage with the first reference voltage; and
a multiplexer configured to receive the initial voltage and the first reference voltage, select any one of the initial voltage and the first reference voltage in response to the selection signal, and output the selected voltage as the first output voltage.

15. A memory device, comprising:
a power-on reset circuit configured to detect a potential level of an external supply voltage, and then generate and output a power-on reset signal;
a reference voltage generation circuit configured to generate a reference voltage by being supplied with the external supply voltage; and
an internal voltage generation circuit activated in response to the power-on reset signal, and configured to be supplied with the external supply voltage, increase a potential level of an internal voltage, and output a potential level-increased internal voltage based on a result of a comparison between an initial voltage that increases with a constant slope and a feedback voltage.

16. The memory device according to claim 15, wherein the internal voltage generation circuit comprises:
an integration circuit configured to generate the initial voltage based on an input voltage;
a first selection circuit configured to compare the feedback voltage with the reference voltage, and then selectively output the initial voltage or the reference voltage; and
a first internal voltage generation circuit configured to compare the initial voltage or the reference voltage, output from the first selection circuit, with the feedback voltage, to generate the internal voltage by being supplied with the external supply voltage or by being blocked from being supplied with the external supply voltage based on a result of the comparison, and to generate the feedback voltage by dividing the internal voltage.

17. The memory device according to claim 16, wherein the first selection circuit selects and outputs the initial voltage during an initial generation interval in which the feedback voltage is lower than the reference voltage, and selects and outputs the reference voltage during an operation interval subsequent to the initial generation interval.

18. The memory device according to claim 17, wherein the initial voltage has a potential level lower than that of the reference voltage during the initial generation interval.

19. The memory device according to claim 16, wherein the selection circuit comprises:
an amplifier configured to generate a selection signal by comparing the feedback voltage with the reference voltage; and
a multiplexer configured to receive the initial voltage and the reference voltage and select and output any one of the initial voltage and the reference voltage in response to the selection signal.

20. The memory device according to claim 16, wherein the internal voltage generation circuit further comprises an enable signal generation circuit configured to generate an enable signal for activating the integration circuit, the first selection circuit, and the first internal voltage generation circuit in response to the power-on reset signal.

* * * * *